United States Patent

Morinaga

[11] Patent Number: 6,143,706
[45] Date of Patent: Nov. 7, 2000

[54] SURFACE TREATMENT COMPOSITION AND METHOD FOR TREATING SURFACE OF SUBSTRATE BY USING THE SAME

[75] Inventor: Hitoshi Morinaga, Fukuoka, Japan

[73] Assignee: Mitsubishi Chemical Corporation, Tokyo, Japan

[21] Appl. No.: 09/013,066

[22] Filed: Jan. 26, 1998

[30] Foreign Application Priority Data

Jan. 27, 1997 [JP] Japan ..................... 9-012232

[51] Int. Cl.$^7$ ................................. C11D 3/30
[52] U.S. Cl. ................. 510/175; 510/167; 510/178; 510/219; 510/243; 510/245; 510/264; 510/499; 510/502; 510/505
[58] Field of Search ..................... 510/167, 175, 510/178, 219, 238, 243, 245, 264, 405, 499, 502, 505

[56] References Cited

U.S. PATENT DOCUMENTS

| | | | |
|---|---|---|---|
| 4,666,528 | 5/1987 | Arrington et al. | 510/245 |
| 4,721,532 | 1/1988 | Kuhn et al. | 510/253 |
| 5,183,573 | 2/1993 | Kreh et al. | 510/253 |
| 5,466,389 | 11/1995 | Ilardi et al. | 510/175 |

FOREIGN PATENT DOCUMENTS 1159462  6/1967  United Kingdom .

*Primary Examiner*—Yogendra Gupta
*Assistant Examiner*—Brian P. Mruk
*Attorney, Agent, or Firm*—Oblon, Spivak, McClelland, Maier & Neustadt, P.C.

[57] ABSTRACT

A surface treatment composition containing a complexing agent as a metal deposition preventive in a liquid medium, in which the complexing agent is an ethylenediaminephenol derivative of the following general formula (1) or its salt:

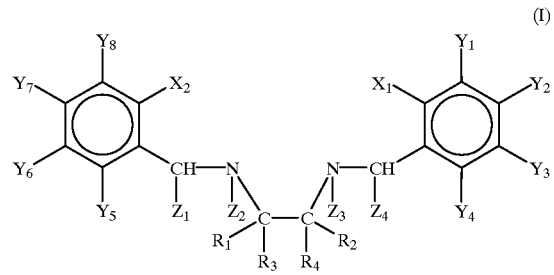

wherein $X_1$ and $X_2$ are hydroxyl groups; $Y_1$ to $Y_8$ are respectively independently a hydrogen atom, a hydroxyl group, a halogen atom, a carboxyl group, a phosphonic acid group, a sulfonic acid group, a carbonyl group, a nitro group, a nitroso group, an amino group, an imino group, a nitrilo group, a nitrile group, a thiocyanate group, a hydroxyamino group, a hydroxyimino group, or an alkyl or alkoxy group which may have a substituent, provided that at least one of $Y_1$ to $Y_8$ is not a hydrogen atom; $Z_1$ to $Z_4$ are respectively independently a hydrogen atom, a carboxyl group or a sulfonic acid group; and $R_1$ to $R_4$ are respectively independently a hydrogen atom or an alkyl group which may have a substituent.

5 Claims, No Drawings

SURFACE TREATMENT COMPOSITION AND METHOD FOR TREATING SURFACE OF SUBSTRATE BY USING THE SAME

The present invention relates to a surface treatment composition and a method for treating the surface of a substrate using the same. More particularly, the present invention relates to a surface treatment composition comprising a liquid medium as the main component, which prevents a substrate surface from being contaminated with metal impurities from the surface treatment composition and stably provides an extremely clean substrate surface, and also relates to a method for treating the surface of a substrate by using the same. Further, the present invention relates to a method for supplying components for the surface treatment composition and a method for purifying a complexing agent used for the composition.

In accordance with high integration of various devices represented by VLSI, TFT liquid crystals and the like, cleanliness levels of substrate surfaces used for these devices are demanded to be higher and higher. Contaminations with various materials disturb to achieve higher cleanliness, and among the contaminations, a metallic contamination particularly deteriorates electric properties of a device, and it is therefore necessary to utmostly lower a metal impurity concentration on a substrate surface for forming a device in order to prevent the above-mentioned deterioration. For this purpose, it is generally conducted to clean a substrate surface with a cleaning agent.

Heretofore, for this type cleaning agent, there are generally used water, electrolyzed ionic water, acid, alkali, oxidizing agent, surfactant aqueous solution or organic solvents and the like. The cleaning agent is demanded not only to have excellent cleaning performances but also to have an impurity concentration of such an extremely low level as to prevent a substrate from being contaminated with a metal impurity from the cleaning agent. In order to satisfy these demands, cleaning chemicals for semiconductors are highly purified, and a metal impurity concentration in the chemicals immediately after purification reaches a level of hardly detectable by present analytical techniques.

Although an impurity in a cleaning agent is lowered to such a low level as to be hardly detectable, it is still difficult to provide a highly clean substrate surface. This is because it can not be avoided that a cleaning agent itself is contaminated with a metal impurity removed from a substrate in a cleaning tank. Thus, a metal impurity separated from a metal surface is incorporated into a cleaning agent and the metal impurity in the contaminated cleaning agent is then deposited on a substrate (reverse contamination).

In a step of cleaning semiconductors, cleaning (SC-1 cleaning) with "ammonia+hydrogen peroxide+water" solution is widely used (see RCA Review, p 187–206, June (1970) etc.). This cleaning is usually conducted at 40–90° C., and the composition ratio of a cleaning solution usually used is (30 wt % aqueous ammonia):(31 wt % hydrogen peroxide):(water)=0.05–1:1:5. However, this cleaning method has high performances to efficiently remove particles and organic materials, but when metals such as Fe, Al, Zn and Ni are present even in a very small amount in the solution, they are deposited on a substrate surface, thus raising a problem of reverse contamination. For this purpose, in the step of cleaning semiconductors, after cleaning with "ammonia+hydrogen peroxide+water" solution, cleaning with an acid cleaning agent such as "hydrochloric acid+hydrogen peroxide+water" solution (SC-2 cleaning) is usually conducted to remove metal contamination on a substrate surface.

Therefore, in the cleaning step, a technique to prevent the reverse contamination has been demanded in order to stably and efficiently provide a highly clean surface.

Further, a problem of deposition of metal impurities in a liquid onto a substrate surface is generally a large problem not only in the cleaning step but also in substrate surface treatment steps using a solution such as an alkali etching step of a silicon substrate, an etching step of a silicon oxide film with dilute hydrochloric acid, and the like. In the etching step with dilute hydrofluoric acid, when noble metal impurities such as Cu and Au are present in the solution, they are deposited on the silicon surface and extremely deteriorate electric properties of devices such as carrier lifetime. Although, in the alkali etching step, when a small amount of metal impurities such as Fe and Al are present in the solution, they are easily deposited on the substrate surface and adversely affect on its quality. Thus, a technique to prevent contamination in a surface treatment step with a solution is strongly demanded.

In order to solve these problems, there is proposed a method for preventing metal impurities from being deposited on a substrate surface by adding a complexing agent such as a chelating agent to a surface treatment agent to trap the metal impurities in the solution as stable water-soluble complexes. For example, JP-A-50-158281 proposes to prevent deposition of metal impurities on a semiconductor substrate surface by adding a complexing agent such as ethylenediaminetetraacetic acid (EDTA) or ammonium cyanide to a tetraalkylammonium hydroxide aqueous solution. JP-A-3-219000 proposes a chelating agent such as catechol and Tiron, JP-A-5-275405 proposes a phosphonic acid type chelating agent or a complexing agent such as condensed phosphoric acid and JP-A-6-163495 proposes a complexing agent such as hydrazone derivative, and they are respectively added to an alkaline cleaning solution such as "ammonia+hydrogen peroxide+water" solution to prevent metal impurity deposition on a substrate, thereby providing a substrate surface not contaminated with particles, organic materials and metals.

However, when these complexing agents are added, deposition of a specific metal (such as Fe) can be prevented or a removal effect can be recognized, but there are problems that the effect of the above-mentioned complexing agent is extremely small with regard to some metals (such as Al) which easily contaminate a treating solution or a substrate and that the effect can not be sufficiently achieved even by adding a large amount of complexing agents. In order to solvent these problems, JP-A-6-216098 proposes to clean a substrate with "ammonia+hydrogen peroxide+water" cleaning solution containing a chelating agent such as a phosphonic acid type chelating agent and then to rinse with a hydrofluoric acid aqueous solution of at least 1 ppm. According to this method, since the cleaning solution containing the phosphonic acid type chelating agent does not substantially reduce Al contamination on the substrate surface, Al is removed by etching with the hydrofluoric acid aqueous solution of at least 1 ppm at the later step. Thus, the effect achieved by the conventional method for preventing metal deposition is not satisfactory, and the metal contamination must be removed at the later stage when the substrate is required to be cleaner. Consequently, the number of steps must be increased, thereby making a production cost large.

The present inventors proposed ethylenediamineorthohydroxyphenylacetic acid (commonly referred to as EDDHA) as a chelating agent in Japanese Patent Application No. 8-56087 (PCT/JP96/02077). This compound corresponds to a compound of the general formula (1) in this invention wherein all of $Y_1$ to $Y_8$ correspond to hydrogen atoms, but is disadvantageous since it requires an additional purification step due to its low yield.

Under these circumstances, various completing agents have been tried to be added in order to prevent a substrate surface from being contaminated with metal impurities from a surface treatment composition, but a satisfactory improvement can not be made and a satisfactory technique for preventing contamination can not be achieved up to now.

The present invention has been made to solve the above-mentioned problems, and provides a surface treatment composition which prevents a substrate surface from being contaminated with metal impurities from the surface treatment composition and stably produces an extremely clean substrate surface, and also provides a method for treating the surface of a substrate by using the same.

The present inventors have extensively studied and found that an effect of preventing a substrate from being deposited with metal impurities from a surface treatment composition is remarkably improved by incorporating a specific complexing agent as a metal deposition preventive into the surface treatment composition.

Thus, the essential feature of the present invention resides in a surface treatment composition containing a complexing agent as a metal deposition preventive in a liquid medium, in which the complexing agent is an ethylenediaminephenol derivative of the following general formula (1) or its salt:

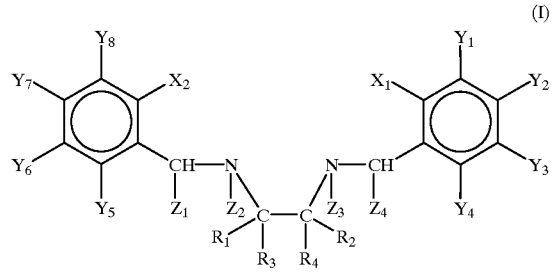

(I)

wherein $X_1$ and $X_2$ are hydroxyl groups; $Y_1$ to $Y_8$ are respectively independently a hydrogen atom, a hydroxyl group, a halogen atom, a carboxyl group, a phosphonic acid group, a sulfonic acid group, a carbonyl group, a nitro group, a nitroso group, an amino group, an imino group, a nitrilo group, a nitrile group, a thiocyanate group, a hydroxyamino group, a hydroxyimino group, or an alkyl or alkoxy group which may have substituents, provided that at least one of $Y_1$ to $Y_8$ is not a hydrogen atom; $Z_1$ to $Z_4$ are respectively independently a hydrogen atom, a carboxyl group or a sulfonic acid group; and $R_1$ to $R_4$ are respectively independently a hydrogen atom or an alkyl group which may have a substituent.

The present invention further includes a method for effectively supplying a treating composition which is lost during the surface treatment to maintain the concentration of a complexing agent and other additives, and a method for purifying an ethylenediaminephenol derivative or its salt.

Hereinafter, the present invention is further described in more detail.

In the present invention, the surface treatment generally refers to cleaning, etching, polishing and coating of a substrate and the surface treatment composition generally refers to a surface treating agent used for these processes.

The surface treatment composition of the present invention is characterized by containing one or more ethylenediaminephenol derivatives of the above general formula (1) or its salt as a metal deposition preventive.

In the above general formula (1), $X_1$ and $X_2$ are hydroxyl groups; $Y_1$ to $Y_8$ are respectively independently a hydrogen atom, a hydroxyl group, a halogen atom, a carboxyl group, a phosphonic acid group, a sulfonic acid group, a carbonyl group, a nitro group, a nitroso group, an amino group, an imino group, a nitrilo group, a nitrile group, a thiocyanate group, a hydroxyamino group, a hydroxyimino group, or an alkyl or alkoxy group which may have a substituent, provided that at least one of $Y_1$ to $Y_8$ is not a hydrogen atom; $Z_1$ to $Z_4$ are respectively independently a hydrogen atom, a carboxyl group or a sulfonic acid group; and $R_1$ to $R_4$ are respectively independently a hydrogen atom or an alkyl group which may have a substituent.

Examples of the above alkyl or alkoxy group which may have a substituent include a methyl group, an ethyl group, a n-propyl group, an i-propyl group, a n-butyl group, a sec-butyl group, a tert-butyl group, a fluoromethyl group, a chloromethyl group, a bromomethyl group, a trifluoromethyl group, a 2-chloroethyl group, a 2-cyanoethyl group and the like, but are not limited thereto.

A hydroxyl group, a phosphonic acid group, a sulfonic acid group or a carboxyl group may dissociate a hydrogen cation and may form an anionic group.

Examples of such a complexing agent are illustrated hereinafter, but should not be limited thereto. Also examples are illustrated as acids, but they include their corresponding salts, such as ammonium salts, alkali metal salts or the like. Names in parentheses indicated after compound names are abbreviations or common names used in the present specification.

(1) Ethylenediaminediorthohydroxyphenylacetic acid (EDDHA) derivatives (ones wherein $Z_1$ and $Z_4$ are carboxyl groups):

Ethylenediamine-N,N'-bis[(2-hydroxy-5-methylphenyl) acetic acid] (EDDHMA), ethylenediamine-N,N'-bis[(2-hydroxy-5-chlorophenyl)acetic acid] (EDDHCA), ethylenediamine-N,N'-bis[(2-hydroxy-5-sulfophenyl)acetic acid] (EDDHSA), ethylenediamine-N,N'-bis[(2-hydroxy-5-phosphophenyl)acetic acid], ethylenediamine-N,N'-bis[(2-hydroxy-5-carboxylphenyl)acetic acid], ethylenediamine-N,N'-bis[(2-hydroxy-5-t-butylphenyl)acetic acid], ethylenediamine-N,N'-bis[(2-hydroxy-3-methylphenyl) acetic acid], ethylenediamine-N,N'-bis[(2-hydroxy-4-methylphenyl)acetic acid], ethylenediamine-N,N'-bis[(2-hydroxy-3,5-dimethylphenyl)acetic acid], ethylenediamine-N,N'-bis[(2-hydroxy-4,6-dimethylphenyl)acetic acid] (EDDHDMA), ethylenediamine-N,N'-bis[(2-hydroxy-4,6-dichlorophenyl)acetic acid], 1,2-bis-(2-hydroxy-α-carboxybenzylamino)-propane, 1,2-bis-(2-hydroxy-α-carboxybenzylamino)-butane, and the like.

(2) N,N'-bis(2-hydroxybenzyl)ethylenediamine-N,N'-diacetic acid (HBED) derivatives (ones wherein $Z_2$ and $Z_3$ are carboxyl groups):

N,N'-bis(2-hydroxy-5-methylbenzyl)ethylenediamine-N,N'-diacetic acid (HMBED), N,N'-bis(2-hydroxy-5-chlorobenzyl)ethylenediamine-N,N'-diacetic acid, N,N'-bis(2-hydroxy-5-sulfobenzyl)ethylenediamine-N,N'-diacetic acid, N,N'-bis(2-hydroxy-5-carboxybenzyl) ethylenediamine-N,N'-diacetic acid, N,N'-bis(2-hydroxy-3-methylbenzyl)ethylenediamine-N,N'-diacetic acid, N,N'-bis (2-hydroxy-4-methylbenzyl)ethylenediamine-N,N'-diacetic acid, N,N'-bis(2-hydroxy-3,5-dimethylbenzyl) ethylenediamine-N,N'-diacetic acid, N,N'-bis(2-hydroxy-4,6-dimethylbenzyl)ethylenediamine-N,N'-diacetic acid, N,N'-bis(2-hydroxy-4,6-dichlorobenzyl)ethylenediamine-N,N'-diacetic acid, and the like.

(3) Others:

Ethylenediamine-N,N'-bis[(2-hydroxy-5-methylphenyl) phosphonic acid], ethylenediamine-N,N'-bis[(2-hydroxy-5-phosphophenyl)phosphonic acid], and the like.

A complexing agent is generally selected by judging a cleaning level required for a substrate surface, a complexing agent cost, a chemical stability in a surface treatment composition, and the like, but it is generally preferable for a metal deposition preventive effect and a production cost to employ ethylenediaminediorthohydroxyphenylacetic acid (EDDHA) derivatives (ones having carboxyl groups at the positions of $Z_1$ and $Z_4$) such as ethylenediamine-N,N'-bis [(2-hydroxy- 5-methylphenyl)acetic acid] (EDDHMA), ethylenediamine-N,N'-bis[(2-hydroxy-5-chlorophenyl) acetic acid] (EDDHCA), and the like. Further, the ethylenediaminephenol derivatives of the present invention are characterized in that at least one of $Y_1$ to $Y_8$ in the general formula (1) is an atom other than a hydrogen atom or a group which may have a substituent, and the ethylenediaminephenol derivatives having the above characteristics of the present invention are excellent in respect to a production cost and a chemical stability as compared with ethylenediaminediorthohydroxyphenylacetic acid (EDDHA) wherein all of $Y_1$ to $Y_8$ are hydrogen atoms as disclosed in Japanese Patent Application No. 8-56087 by the present inventors.

Further, the surface treatment composition of the present invention may additionally contain at least one of the following complexing agents in addition to the above specific complexing agents in combination. In the complexing agents illustrated below, names described in parentheses after the compound names indicate common names or abbreviations.

Amines such as ethylenediamine, 8-quinolinol and 0-phenanthroline; amino acids such as glycine; imino carboxylic acids such as iminodiacetic acid, nitrilotriacetic acid, ethylenediaminetetraacetic acid (EDTA), trans-1,2-diaminocyclohexanetetraacetic acid (CyDTA), diethylenetriaminepentaacetic acid (EDPA) and triethylenetetraaminehexaacetic acid (TTHA); imino phosphonic acids such as ethylenediaminetetrakis (methylenephosphonic acid) (EDTPO), nitrilotris (methylenephosphonic acid) (NTPO) and propylenediamine tetra (methylenephosphonic acid) (PDTMP); carboxylic acids such as formic acid, acetic acid, oxalic acid and tartaric acid; hydrogen halides such as hydrofluoric acid, hydrochloric acid, hydrogen bromide and hydrogen iodide or their salts; oxoacids such as sulfuric acid, phosphoric acid, condensed phosphoric acid, boric acid, silicic acid, carbonic acid, nitric acid, nitrous acid, perchloric acid, chloric acid, chlorous acid and hypochlorous acid or their salts; and the like.

An amount of a completing agent to be added as a metal deposition preventive can not be simply determined since the amount added is depending on the kind and amount of a metal impurity in a liquid medium, the deposition of which is prevented, and a cleaning level demanded for a substrate surface, but the total amount to be added in a surface treatment composition is generally from $10^{-7}$ to 2 wt %, preferably from $10^{-6}$ to 0.5 wt %, more preferably from $10^{-5}$ to 0.1 wt %. If the above amount is too small, the aimed metal deposition preventive effect of the present invention is hardly achieved. On the other hand, if the above amount is too large, the aimed effect can not be achieved any further and there is a fear that the complexing agent as a metal deposition preventive tends to be unfavorably deposited on a substrate surface.

Examples of a liquid medium used as the main component for a surface treatment composition of the present invention include generally water, electrolyzed ionic water, an organic solvent or an aqueous solution having an acid, an alkali, an oxidizing agent, a reducing agent, a surfactant or the like dissolved, or their mixture solutions. Particularly when an alkaline aqueous solution or a dilute hydrofluoric acid solution is used for cleaning or etching a semiconductor substrate, metal impurities in the solution are very easily deposited on a substrate surface, and therefore in such cases, it is preferable to use these solutions by adding a complexing agent in accordance with the present invention. Further, the surface treatment composition of the present invention may additionally contain solid materials such as particles of polishing materials as a by-component.

In the present invention, the alkaline aqueous solution means generally an aqueous solution having a pH value of higher than 7. Examples of an alkaline component in this aqueous solution are not especially limited, but typically include ammonia. Also, other usable examples include alkali metal or alkali earth metal hydroxides such as sodium hydroxide, potassium hydroxide and calcium hydroxide, alkaline salts such as sodium hydrogen carbonate and ammonium hydrogen carbonate, or quaternary ammonium salt hydroxides such as tetramethylammonium hydroxide (TMAM), trimethyl-2-hydroxyethylammonium hydroxide and choline, and the like. These alkalis may be added in a mixture of two or more, and the total concentration of the total solution of surface treatment composition is adjusted to from 0.01 to 30 wt %. Also, alkali electrolyzed ionic water obtained by electrolysis of water is preferably used. Further, to such an alkaline aqueous solution, an oxidizing agent such as hydrogen peroxide may be optionally added. In a cleaning step of semiconductor wafer, when cleaning bare silicon (having no oxidized film), it is possible to control etching or surface-roughening of the wafer by incorporating an oxidizing agent. When hydrogen peroxide is incorporated into the alkaline aqueous solution of the present invention, the hydrogen peroxide concentration in the total solution of surface treatment composition is generally adjusted within the concentration range of from 0.01 to 30 wt %. When an oxidizing agent is used, the oxidizing agent concentration is preferably adjusted to from 1 ppm by weight to 3 wt %. If the amount of the oxidizing agent is too large, a complexing agent is decomposed, and the stability of the surface treatment composition tends to become poor. Particularly, when hydrogen peroxide is used as the oxidizing agent, the hydrogen peroxide concentration is preferably from 100 ppm by weight to 3 wt %.

Method for blending the complexing agent of the present invention with a surface treatment composition is not especially limited. The complexing agent may be blended previously with one component or plural components of the components constituting a surface treatment composition (such as aqueous ammonia, hydrogen peroxide, water and the like), and then these components may be mixed. Alternatively, the complexing agent may be blended with a mixture solution obtained after mixing the components.

Also, the complexing agent may be added in the form of an acid or it may be added in the form of a salt such as an ammonium salt.

In the case of SC-1 cleaning, surface treatment is carried out with a composition of (ammonia+hydrogen peroxide+water+metal deposition preventive), but when the surface treatment composition is used for a long time, ammonia is evaporated and the metal deposition preventive is gradually decomposed, thereby degrading the metal deposition preventive effect. Therefore, when the evaporated ammonia content is supplied, the supplement is conducted preferably with an aqueous ammonia containing a metal deposition preventive. A concentration of ammonia in the aqueous ammonia to be supplied and a concentration of a complexing agent to be added as a metal deposition preventive are determined by weight ratios of evaporated ammonia, water and a decomposed complexing agent. Amounts of the evaporated ammonia and water are depending on an ammonia concentration in the initial surface treatment composition, a surface treatment temperature and the like. Also, an amount of a complexing agent to be decomposed is depending on a kind of a complexing agent in the initial surface treatment composition, a concentration of the complexing agent and surface treatment conditions. Generally, when the surface treatment temperature is high or when the surface treatment composition contains hydrogen peroxide at a high concentration, the decomposition of a complexing agent is promoted. The ammonia concentration and the complexing agent concentration in aqueous ammonia to be supplied are generally determined by these factors, and the ammonia concentration is generally from 0.1 to 35 wt %, preferably from 5 to 32 wt %, and the complexing agent concentration is generally from $10^{-7}$ to 5 wt %, preferably from $10^{-6}$ to 1 wt %. A metal impurity content in the complexing agent-containing aqueous ammonia to be supplied is preferably at most $10^{-4}$ wt % per metal. If the metal impurity content is too large, it is not desirable from economical viewpoint since a large amount of a complexing agent is consumed for preventing metal deposition.

The surface treatment composition of the present invention is used for surface treatment operations including cleaning, etching, polishing, deposition and the like, for substrates such as semiconductor, metal, glass, ceramics, plastic, magnetic material, superconductor and the like, the metal impurity contamination of which becomes troublesome. The present invention is preferably applied particularly to cleaning or etching of a semiconductor substrate, the surface of which is demanded to be highly clean. Among the cleaning operations of semiconductor substrate, when the present invention is applied particularly to alkali cleaning with a cleaning solution comprising (ammonia+hydrogen peroxide+water), the problem of said cleaning method, i.e. the problem of metal impurity deposition on a substrate can be solved, and by this cleaning, there can be satisfactorily provided a highly clean substrate surface without being contaminated with particles, organic materials and metals.

The reason why the surface treatment composition of the present invention achieves a very satisfactory effect of preventing deposition of metal impurities, is not clear up to now, but it is considered that a specific complexing agent reacts with metal ions to rapidly form a very stable water-soluble metal complex.

When the surface treatment composition of the present invention is used as a cleaning solution for cleaning a substrate, a method of bringing the cleaning solution directly into contact with the substrate is employed. Examples of such a cleaning method include dipping type cleaning wherein a substrate is dipped in the cleaning solution in a cleaning tank, spraying type cleaning wherein the cleaning solution is sprayed on a substrate, spinning type cleaning wherein the cleaning solution is dropped on a substrate rotated at a high speed, and the like. In the present invention, among the above-mentioned cleaning methods, a suitable method is employed depending on an object. Dipping type cleaning method is suitable for cleaning many substrates at one time, but it takes a long time for one cleaning. Spray type cleaning method or spin type cleaning method can clean only a small number of substrates at one time, but a cleaning time required for one cleaning is short. The cleaning time required by the dipping type cleaning method is generally from 30 seconds to 30 minutes, preferably from 1 to 15 minutes, and the cleaning time required by the spray type or spin type cleaning method is generally from 1 second to 15 minutes, preferably from 5 seconds to 5 minutes. If the cleaning time is too short, the cleaning effect is not satisfactory. On the other hand, if the cleaning time is too long, it is meaningless since the throughput becomes poor and the cleaning effect is not raised any further. The cleaning may be carried out at normal temperature, but may be carried out at a heated temperature to improve the cleaning effect. Also, the cleaning may be carried out in combination with a cleaning method employing a physical force. Examples of the cleaning method employing a physical force include ultrasonic cleaning, mechanical cleaning employing a cleaning brush, and the like.

In the preparation of a surface treatment composition, a complexing agent sometimes becomes a metal contamination source. An ordinary reagent for the complexing agent contains metal impurities such as Fe in an amount of from several to several thousands ppm. These metal impurities are present as a stable complex with the complexing agent at the initial stage, but when the complexing agent is used as a surface treatment solution for a long time, the complexing agent is decomposed and metals become free and are deposited on the substrate surface. Therefore, the content of at least one metal element of Fe, Al and Zn in the complexing agent to be used is preferably at most 5 ppm, and it is particularly preferable that the Fe content is at most 5 ppm, the Al content is at most 2 ppm and the Zn content is at most 2 ppm. Also, each content of Fe, Al and Zn in the surface treatment composition is preferably at most 5 ppb. Such a complexing agent can be obtained by purification by dissolving an ethylenediaminephenol derivative or its salt of this invention in an acidic or alkaline solution, removing insoluble impurities by filtration, precipitating a crystal by neutralization and finally separating the crystal from the solution. The separation by filtration is preferably conducted by a precise filter having an opening diameter of at most 0.5 μm.

EXAMPLES

Now, the present invention will be described in further detail with reference to Examples. However, it should be understood that the present invention is not limited to such specific Examples within the scope of the subject matter of the present invention.

EXAMPLES 1 TO 5 AND COMPARATIVE EXAMPLES 1 TO 4

Aqueous ammonia (30 wt %), hydrogen peroxide (31 wt %) and water were mixed in a volume ratio of 1:1:10, and to the aqueous solvent thus obtained, was added a predetermined amount of each complexing agent shown in the following Table 1 as a metal deposition preventive to prepare a surface treatment composition. The amount of the complexing agent added was expressed by wt %, and the name of the complexing agent was expressed by the above-mentioned common name. Comparative Examples were prepared respectively by adding ethylenediaminetetrakis (methylsulfonic acid) (common name: EDTPO) disclosed in JP-A-5-275405 as a complexing agent; by adding nitrilotris (methylsulfonic acid) (common name: NTPO) as a complexing agent; by adding ethylenediaminetetraacetic acid (common name: EDTA) as a typical complexing agent; or by adding no complexing agent.

To each of the surface treatment solutions, was added 5 ppb of each of Al and Fe (by using chlorides), and a clean silicon wafer (p type, CZ, plane orientation (100)) was dipped for 10 minutes in each of the surface treatment solutions. During dipping, a liquid temperature of each surface treatment solution was raised and maintained at 40–50° C. After dipping, each silicon wafer was overflow-rinsed with ultra-pure water for 10 minutes, and was dried with nitrogen blow to determine Al and Fe deposited on the wafer surface. Al and Fe deposited on the silicon wafer were recovered with a mixture solution of 0.1 wt % of hydrofluoric acid and 1 wt % of hydrogen peroxide, and the metal amounts were measured by flameless atomic absorption spectrometry and were converted into a substrate surface concentration (atoms/cm$^2$). The results are shown in the following Table 1.

TABLE 1

| | Complexing agent | Added amount (wt %) | Metal deposit amount ($\times 10^{10}$ atoms/cm$^2$) | |
|---|---|---|---|---|
| | | | Al | Fe |
| Example 1 | EDDHMA | 0.01 | 15 | <3 |
| Example 2 | EDDHCA | 0.01 | 23 | <3 |
| Example 3 | EDDHSA | 0.01 | 25 | <3 |
| Example 4 | HMBED | 0.01 | 45 | <3 |
| Example 5 | EDDHDMA | 0.01 | 15 | <3 |
| Comparative Example 1 | None | 0 | 1800 | 250 |
| Comparative Example 2 | EDTPO | 0.01 | 350 | <3 |
| Comparative Example 3 | NTPO | 0.01 | 1200 | <3 |
| Comparative Example 4 | EDTA | 0.01 | 1000 | <3 |

EXAMPLES 6 TO 8 AND COMPARATIVE EXAMPLES 5 TO 9

Aqueous ammonia (30 wt %), hydrogen peroxide (31 wt %) and water were mixed in a volume ratio of 1:1:10, the mixture solution thus obtained was used as the main component for forming an aqueous solvent. To the aqueous solvent thus formed, was added a predetermined amount of at least 2 specific complexing agents of the present invention disclosed in Table 1 to prepare a surface treatment composition of the present invention. Comparative Examples were prepared respectively by adding one of the complexing agents used in Examples; by adding EDTPO (ethylenediaminetetrakis(methylsulfonic acid)) disclosed in JP-A-5-275405 as a complexing agent; or by adding no complexing agent. However, it should be noted that Comparative Example 5 is the same as Comparative Example 1; that Comparative Example 6 is the same as Example 1; that Comparative Example 8 is the same as Example 2; and that Comparative Example 9 is the same as Comparative Example 2.

To the surface treatment solutions thus prepared, were added 5 ppb of each of Al and Fe (by using chlorides), and a clean silicon wafer (p type, CZ, plane orientation (100)) was dipped for 10 minutes in each of the surface treatment solutions. During dipping, a liquid temperature of each surface treatment solution was raised and maintained at 40–50° C. After dipping, the silicon wafer was overflow-rinsed with ultra-pure water for 10 minutes and was then dried by nitrogen blow to determine Al and Fe deposited on the wafer surface. Al and Fe deposited on the wafer were recovered with a mixture solution of 0.1 wt % of hydrofluoric acid and 1 wt % of hydrogen peroxide, and the metal amounts were measured by flameless atomic absorption spectrometry and were converted into a substrate surface concentration (atoms/cm$^2$). The results are shown in the following Table 2.

TABLE 2

| | | Complexing agent (added amount/wt %) | | Metal deposit amount ($\times 10^{10}$ atoms/cm$^2$) | |
|---|---|---|---|---|---|
| | | | | Al | Fe |
| Example | 6 | EDDHMA (0.01) | o-phenanthroline (0.01) | 10 | <3 |
| | 7 | EDDHMA (0.01) | Acetic acid (0.01) | 9 | <3 |
| | 8 | EDDHCA (0.01) | Acetic acid (0.01) | 18 | <3 |
| Comparative Example | 5 | None | | 1800 | 250 |
| | 6 | EDDHMA (0.01) | | 15 | <3 |
| | 7 | o-phenanthroline (0.1) | | 1800 | 240 |
| | 8 | EDDHCA (0.01) | | 23 | <3 |
| | 9 | EDTPO (0.1) | | 350 | <3 |

The surface treatment composition of the present invention containing a specific complexing agent as a metal deposition preventive, prevents a substrate surface from being contaminated with metal impurities such as Al and Fe from the surface treatment composition, and stably provides an extremely clean substrate surface.

Particularly, when the present invention is applied to alkali cleaning of a semiconductor substrate represented by "ammonia+hydrogen peroxide+water" cleaning, a conventional problem of this cleaning method concerning a metal impurity deposition problem is solved, and a highly clean substrate surface can be provided by this cleaning without being contaminated with particles, organic materials and metals. Thus, conventionally employed acid cleaning such as "hydrochloric acid+hydrogen peroxide+water" cleaning conducted after this cleaning can be omitted, and it is therefore possible to largely reduce the cleaning cost, a clean room cost including an exhauster equipment and the like, thus being largely advantageous in industrial production of semiconductor integrated circuits.

In wet process for etching or cleaning in the preparation of semiconductors, liquid crystal display or the like, ultra-pure water and ultra-pure reagents having a metal impurity concentration of at most 0.1 ppb are used. Further, it is necessary to often replace a surface treatment composition since metal impurities are incorporated therein during using. However, according to the present invention, since it is possible to prevent metal deposition even when a large amount of metal impurities are present in a surface treatment composition, it is not necessary to use ultra-pure reagents and it is not necessary to often replace the composition even when it is contaminated with metal impurities during using. Thus, a large amount of reduction can be made in respect to reagent costs and managing costs.

If a metal is present on the surface of substrate in etching or cleaning of a substrate, the substrate surface tends to be electrochemically deposited with a metal when a metal having an ionization tendency higher than that of a metal to be treated. But according to the present invention, this can be prevented because metal impurities are converted into water-soluble metal complexes.

Further, when the present invention is applied to a polishing agent slurry for polishing a substrate, it is possible to prevent deposition of metal impurities to the substrate, even when they are present in the polishing agent slurry in a large amount and are concentrated in the slurry during polishing the substrate.

As mentioned above, the surface treatment agent of the present invention is very effective and industrially very useful.

What is claimed is:

1. A surface treatment composition for treating the surface of a semi-conductor substrate containing a complexing agent as a metal deposition preventive in a liquid medium, in which the complexing agent is an ethylenediaminephenol derivative of the following general formula (1) or its salt:

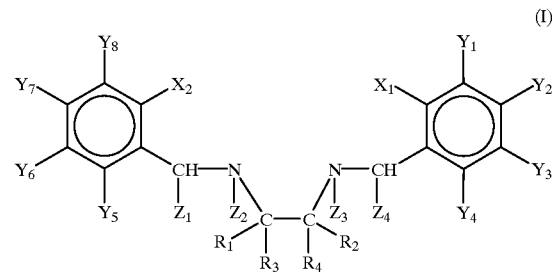

wherein $X_1$ and $X_2$ are hydroxyl groups; $Y_1$ to $Y_8$ are respectively independently a hydrogen atom, a halogen atom, a sulfonic acid group, an alkoxy group which may have a substituent, or an alkyl substituted with halide or cyano, provided that at least one of $Y_1$ to $Y_8$ is not a hydrogen atom; $Z_1$ and $Z_4$ are respectively independently a hydrogen atom, a carboxyl group or a —$CH_2CO_2H$ group; $Z_2$ and $Z_3$ are respectively independently a hydrogen atom or a —$CH_2CO_2H$ group; and $R_1$ to $R_4$ are respectively independently a hydrogen atom or an alkyl group which may have a substituent, wherein said liquid medium contains an alkaline component selected from the group consisting of ammonia, quaternary ammonium salt hydroxides, potassium hydroxide, sodium hydroxide, calcium hydroxide, sodium hydrogen carbonate and ammonium hydrogen carbonate at a concentration of the alkaline compound of from 0.01 to 30 wt %, a concentration of the formula (1) complexing agent from $10^{-7}$ to 5 wt % and a metal impurity concentration per each metal of at most $10^{-4}$ wt %.

2. The surface treatment composition according to claim 1, wherein the liquid medium is an alkaline aqueous solution containing ammonia and hydrogen peroxide.

3. The surface treatment composition according to claim 1, wherein the liquid medium contains from $0^{-4}$ wt % to 3 wt % of an oxidizing agent.

4. The composition of claim 1, in which at least one metal element content of Fe, Al and Zn is at most 5 wt ppm.

5. The composition of claim 1, wherein an Fe content is at most 5 wt ppm, an Al content is at most 2 wt ppm and a Zn content is at most 2 wt ppm.

* * * * *